United States Patent [19]

Jin et al.

[11] Patent Number: 4,737,112
[45] Date of Patent: Apr. 12, 1988

[54] ANISOTROPICALLY CONDUCTIVE COMPOSITE MEDIUM

[75] Inventors: Sungho Jin, Millington; John J. Mottine, Jr., West Keansburg; Stephen G. Seger, Jr., Summit; Richard C. Sherwood, New Providence; Thomas H. Tiefel, Piscataway, all of N.J.

[73] Assignee: American Telephone and Telegraph Company, AT&T Bell Laboratories, Murray Hill, N.J.

[21] Appl. No.: 903,729

[22] Filed: Sep. 5, 1986

[51] Int. Cl.$^4$ .............................................. H01R 9/09
[52] U.S. Cl. ...................................... 439/66; 264/24; 428/900
[58] Field of Search .............. 339/17 M, 59 M, 61 M, 339/DIG. 3; 264/24, 108; 428/900; 156/272.4; 439/65-74, 91

[56] References Cited

U.S. PATENT DOCUMENTS

| 4,003,621 | 1/1977 | Lamp | 339/59 M |
| 4,113,981 | 9/1978 | Fujita et al. | 174/88 R |
| 4,170,677 | 10/1979 | Hutcheson | 156/272.4 |
| 4,209,481 | 6/1980 | Kashiro et al. | 264/24 |
| 4,292,261 | 9/1981 | Kotani et al. | 264/24 |
| 4,548,862 | 10/1985 | Hartman | 428/323 |
| 4,606,962 | 8/1986 | Reylek et al. | 152/272.2 |
| 4,644,101 | 2/1987 | Jin et al. | 428/900 |

FOREIGN PATENT DOCUMENTS 2068645A 8/1981 United Kingdom .

OTHER PUBLICATIONS

"Test Fixture for Testing Chip Carrier Devices Assembled in Larger Circuits", *Technical Notes*, A Publication of RCA, Princeton, NJ, 1982, pp. 1-4.
"Universal Test Fixture for Testing Chip Carriers", *Technical Notes*, A Publication of RCA, Princeton, NJ, 1982, pp. 1-4.
"Investigation of Electrically Conducting Anisotropic Structures in Polymer Materials", V. E. Gul' and M. G. Golubeva, *Kolloidnvi Zhurnal*, vol. 30, No. 1, pp. 13-18, Jan.-Feb., 1968.

*Primary Examiner*—Neil Abrams
*Attorney, Agent, or Firm*—Peter A. Businger

[57] ABSTRACT

Electrical interconnection is established by means of an anisotropically conductive, composite layer medium comprising electrically conductive particles in a nonconductive matrix material. Enhanced uniformity of conductivity across the medium, and minimized incidence of lateral shorting are achieved as a result of essentially uniform distribution of electrically conductive particles which are also magnetic, such distribution resulting upon application of a magnetic field essentially perpendicular to a layer before or during hardening of the matrix material.

7 Claims, 2 Drawing Sheets

ANISOTROPICALLY CONDUCTIVE COMPOSITE MEDIUM

TECHNICAL FIELD

The invention is concerned with electrical interconnection by means of an anisotropically conducting composite medium and with the manufacture of such medium.

BACKGROUND OF THE INVENTION

Anisotropically conductive interconnection media have been proposed for establishing temporary or permanent electrical connections, e.g., between device contacts and corresponding contacts on a supporting substrate, thereby replacing solder connections or substituting for test probes. Such a medium typically is based on the use of a composite material which comprises electrically conducting elements in a nonconductive matrix material. Electrically conducting elements may take the form of wire segments as disclosed, e.g., in the following items:

U.S. Pat. No. 4,003,621, issued Jan. 18, 1977 to R. W. Lamp; R. L. Schelhorn, "Test Fixture for Testing Chip Carrier Devices Assembled in Larger Circuits", RCA Technical Notes, TN No. 1315, Oct. 12, 1982; and R. L. Schelhorn, "Universal Test Fixture for Testing Chip Carriers", RCA Technical Notes, TN No. 1316, Oct. 12, 1982.

Manufacture of a wire-based interconnection medium may involve cutting from a block as disclosed in U.S. Pat. No. 4,003,621 cited above; alternatively, and as disclosed in U.S. Pat. No. 4,209,481, issued June 24, 1980 to Y. Kashiro et al., manufacture may involve magnetic alignment of pre-cut wire segments in a layer of nonconductive material.

As an alternative to an interconnection medium including wire segments, interconnection media have been proposed in which spherical or near-spherical particles serve the function of bridging between surfaces; in this respect see, e.g., the following items:

U.S. Pat. No. 4,113,981, issued Sept. 12, 1978 to M. Fujita et al. and UK Patent Application GB 2,068,645 A, published Aug. 12, 1981 for W. Harper.

In yet another type of interconnection medium, anisotropic conductivity is due to particle chains between opposite surfaces of a layer or sheet medium, such chains providing for electrical interconnection across the thickness of the medium while contact points or pads on the same side of the medium remain insulated. While a statistical effect known as percolation may be effective to meet such requirements, alternate structures have been proposed in which desired chain formation is more positively imposed. In particular, particle alignment by magnetic means has been advocated.

This approach provides for alignment for magnetic particles into electrically conducting columnar chains upon application of a magnetic field in the direction of desired conduction; in this respect, see, e.g., V. E. Gul et al., "Investigation of Electrically Conducting Anisotropic Structures in Polymer Materials. Influence of a Magnetic Field on the Conductivity of Polymer Materials Containing Conductive Fillers", Kolloidnyi Zhurnal, Vol 30 (1968), pp. 13–18; U.S. Pat. No. 4,548,862, issued Oct. 22, 1985 to R. B. Hartman; and U.S. patent application Ser. No. 728,813, filed Apr. 30, 1985, now U.S. Pat. No. 4,644,101, issued Feb. 17, 1987 to S. Jin et al.

As compared with single-particle bridging, the use of conductive chains is advantageous for interconnection between uneven surfaces or contact structures because chains may be compressed or bent to accommodate differences in surface distance. Where such differences are of no concern, bridging may be preferred because of its freedom from additional internal contact surfaces, resulting in optimally low contact resistance. With respect to such single-particle, bridging interconnection there remain concerns, however, with the distribution of particles in a layer medium so as to prevent particle agglomerations as well as voids, the former leading to electrical shorting, and the latter to high contact resistance or even complete failure of contact.

SUMMARY OF THE INVENTION

It has been found that particle distribution in a bridging-type interconnection medium is rendered essentially uniform when a magnetic field is applied before and/or during hardening of a layer medium comprising electrically conducting, magnetic particles in an essentially nonconducting matrix material. When a resulting medium is used for electrical interconnection, reliable electrical contact is obtained across the layer medium, and lateral shorting is prevented.

DETAILED DESCRIPTION

Figure 1:
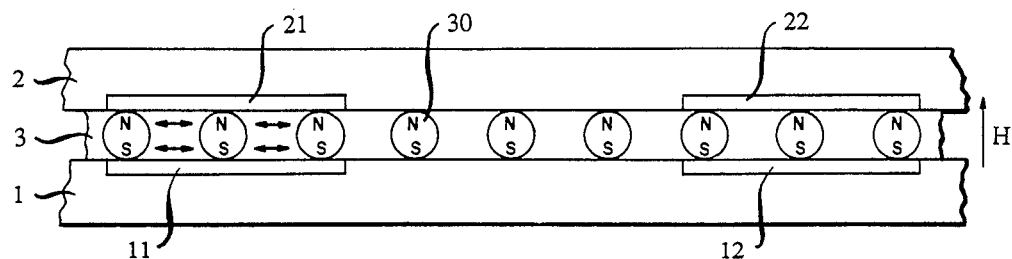
FIG. 1 is a schematic, cross-sectional representation of a portion of a device comprising an exemplary electrical interconnection medium in accordance with the invention, as well as diagrammatic representation of physical principles relevant with respect to the invention.

FIG. 1 shows a first device component 1 with electrical contact pads 11 and 12 and a second device component 2 with electrical contact pads 21 and 22 which are opposite and aligned with respective contact pads 11 and 12. Shown further are nonconductive matrix material 3 and electrically conductive magnetic particles 30 embedded in matrix material 3. Particles 30 are shown as establishing electrical bridging interconnection between facing contact pads 11 and 21 as well as between contact pads 12 and 22, while unintended electrical contact is prevented between pairs 11 and 12, 11 and 22, 21 and 22, and 21 and 12. Particles 30 are shown magnetized N-S by magnetic field H, resulting in lateral repulsion between particles as indicated by arrows.

In specific embodiments, device component 1 and/or device component 2 may be a circuit board (flexible or rigid), a ceramic or semiconductor substrate, or a packaged or unpackaged integrated circuit chip. The nonconductive matrix material may serve as an adhesive between components 1 and 2, both contact pads as well as in regions in between. Alternatively or in combination, a device assembly may be fixed by clamps or other means for producing a compressive force on the interconnection medium.

Figure 2:
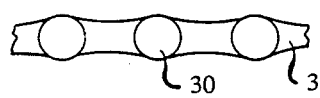
FIG. 2 is a schematic, cross-sectional representation of a portion of an electrical interconnection medium in accordance with the invention, such medium comprising an elastomeric matrix material.

FIG. 2 shows elastomeric (or hardened adhesive) material 3 and electrically conductive magnetic particles 30, forming an interconnection medium in which particles protrude from material 3. In the case of an elastomeric matrix material, this structure is beneficial in the interest of optimal physical contact between particles and contact surfaces, resulting in minimized contact resistance. Alternatively, in the adhesive case, this structure may used in combination with additional adhesive material for establishing permanent adhesive interconnection at the time the medium is placed between components to be electrically interconnected and physically bonded. Such additional adhesive material may be supplied in liquid or in thermoplastic sheet form; in the latter case, heat-and-pressure bonding is indicated for establishing interconnection.

Figure 3:
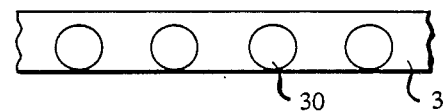
FIG. 3 is a schematic, cross-sectional representation of a portion of an alternate electrical interconnection medium in accordance with the invention, such medium comprising an adhesive matrix material.

FIG. 3 shows a layer of adhesive material 3 and electrically conductive magnetic particles 30 such that there is excess adhesive material covering particles 30. When such a layer is used for interconnection, excess adhesive serves to make positive initial surface contact and, upon application of pressure, is squeezed out laterally (or fills valleys and domes as may be present in-between contact regions) as electrical contact is established by bridging particles. Alternatively, an interconnection medium having cross-sectional structure as shown in FIG. 3 may include an elastomeric rather than an adhesive matrix material; in this case, additional pressure is required to establish interconnection as particles puncture through surface elastomeric material.

Figure 4:
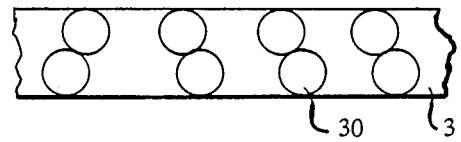
FIG. 4 is a schematic, cross-sectional representation of a portion of a further alternative of an electrical interconnection medium in accordance with the invention, such medium being shown ready for incorporation in a device.
Figure 5:
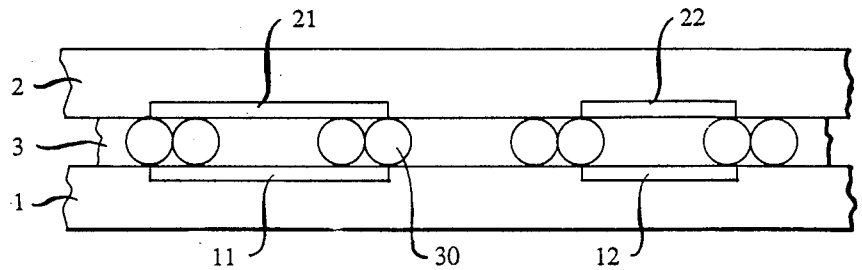
FIG. 5 is a schematic, cross-sectional representation of a portion of a device incorporating the electrical interconnection medium of FIG. 4, such medium being under compression.

FIG. 4 shows a layer of elastomeric (or liquid or hardened epoxy) material 3 and electrically conducting magnetic particles 30 which are evenly distributed as pairs in the layer material. Particles in a pair are offset relative to each other from the direction perpendicular to the layer material so that, upon application of pressure for interconnection, particles are pressed into the same plane. The result is illustrated in FIG. 5 which differs from FIG. 1 only in that, instead of individual particles, pairs of closely spaced particles 30 are shown.

Figure 6:
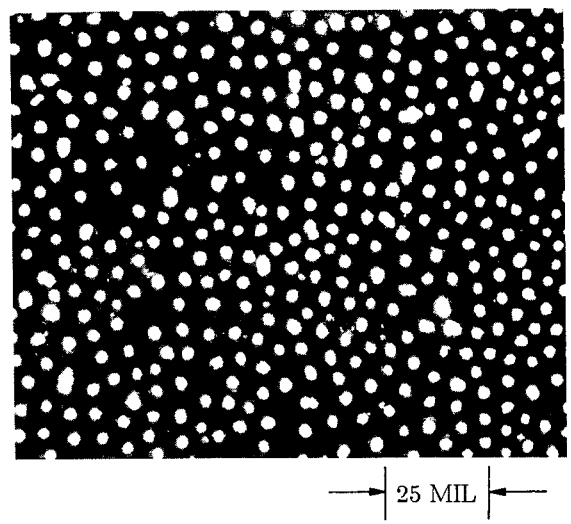
FIG. 6 is a micrograph of a portion of an electrical interconnection medium in accordance with the invention.
Figure 7:
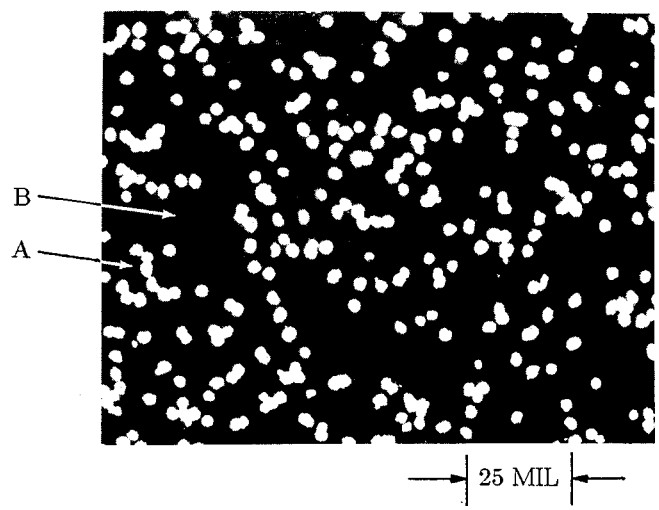
FIG. 7 is a micrograph of a portion of a prior-art electrical interconnection medium.

FIG. 6 illustrates even spacing of particles in an interconnection medium in accordance with the invention as a result of exposure to a magnetic field perpendicular to the plane of the Drawing. This is contrasted with irregular spacing as shown in FIG. 7 for a prior-art interconnection medium made without application of a magnetic field.

Nonconductive matrix materials may have eleastomeric, adhesive, thermoplastic, and/or glassy properties; among suitable materials are polymeric materials such as, e.g., silicone rubber, epoxies, and resins. Particles are magnetic in the sense that they comprise a magnetic material such as, e.g., iron, nickel, cobalt, an alloy comprising iron, nickel, or cobalt, or a ferrite material. Also, particles are electrically conducting in the sense that at least a surface portion of the particles is electrically conducting. For example, particles may have a magnetic core and a conductive surface; or, particles may have a non-magnetic, non-conductive core portion which is coated with a magnetic, conductive coating. For the sale of corrosion resistance and high conductivity, particles may have a surface coating which may be made, e.g., of silver, gold, or an alloy comprising silver or gold. Alternatively, for the sake of enhanced mechanical and electrical contact between particles and contact pads to be interconnected, particle surface material may be soft and easily deformable in the case of a coating with tin, indium, lead, solder, or similar alloy. Particles may be spherical, nearspherical, or of irregular shape, and typical particle diameters are in the range of from approximately 0.1 to 500 micrometers, preferably in the range of from 1 to 200 micrometers. Aspect ratio, defined as the ratio between longest and shortest diameter of a particle, is preferably less than 2.

Contact pads used with the interconnection medium typically have a size in the range from 1 to 200 mils, sizes less than 100 mils being preferred. Spacing of contact pads typically is about the same as pad size.

Manufacture of an interconnection medium in accordance with the invention may involve one of the following alternatives:

mixing of constituent particles and matrix material, degassing, and sheeting out on a substrate or device surface as a layer having onesphere thickness;

random sprinkling of a controlled amount of conductive particles onto the surface of a sheeted-out, uncured matrix material having desired thickness, followed by gravity-penetration of the particles into the matrix material; or mixing of the particles in dilute matrix material such as, e.g., methyl-ethyl-ketone-diluted silicone rubber or a solvent-based thermoplastic resin, sheeting out into a thin layer, and evaporation of the diluent.

Subsequent magnetic field processing and hardening may involve a process such as, e.g., curing, solidification, gelation, or polymerization. For example, curing of silicone rubber and thermosetting resins may be by heating in a furnace or by inductive or microwave means. Alternatively, light-sensitive resins may be cured upon exposure to optical radiation which may be visible, infrared, or ultraviolet.

An adhesive composite medium may be hardened in-situ or else processed into sheet form suitable for heat-and-pressure bonding between components to be interconnected. Since sheets of this type preferably have a thickness somewhat in excess of particle diameter (see FIG. 3), particle distribution in a sheet prior to incorporation in a device may be less regular in that particle pairs may form upon magnetic field treatment (see FIG. 4). Since such pairs tend to stick together upon incorporation of the medium in a device, care is required that particle size be sufficiently small relative to contact pads size in order for such pairs not to cause lateral shorts. It was found that particle distribution is evened out more expeditiously in the medium of FIG. 4 as compared with that of FIGS. 2 and 3, preferred thickness of the nonconductive matrix material in this respect being in a range of from 1.2 to 1.8 times particle diameter.

EXAMPLE 1

Gold-coated nickel spheres having a diameter of approximately 75 micrometers were sprinkled onto a layer of RTV silicone rubber No. 615 as obtained from the General Electric Company. The spheres constituted approximately 12 percent by volume of the mixture, and the silicone rubber matrix layer had a thickness of approximately 65 micrometers (see FIG. 2). A 500-oersted magnetic field was applied perpendicular to the layer and the layer was allowed to cure. Samples were cut from the layer, and contact resistance of a number of such samples was measured between 25-by-25-mil electrodes by means of a standard four-point probe, using a current strength of approximately 100 mA and a pressure of approximately 10 psi applied to the sample. Measured values were in the range of from approximately 0.8 milliohm to approximately 6 milliohms, with a mean value of approximately 3.1 milliohms. Isolation resistance was found to be greater than $10^{11}$ ohms.

For the sake of comparison, contact resistance was also determined for samples which were processed as described above except that no magnetic field was applied during curing. These samples had randomly distributed conductive particles and their contact resistance was found to be in a range of from approximately 0.5 milliohm to approximately 43 milliohms, with a mean value of approximately 8.5 milliohms.

EXAMPLE 2

Gold-coated nickel spheres having a diameter of approximately 40 micrometers were mixed with Hardman epoxy No. 04004; the spheres constituted approximately 10 percent by volume of the mixture. The mixture was applied as a 50-micrometer-thick layer onto the surface of a printed-circuit board (see FIG. 3), exposed for approximately 2 minutes to a 400-oersted magnetic field, and capped with a matching printed-circuit board. The size of contact pads was approximately 25 by 25 mils. Electrical contact resistance between facing contacts was found to be in the range of from approximately 0.3 milliohm to 5 milliohms, with a mean value of approximately 1.9 milliohm.

For the sake of comparison a sample was processed as above except that no magnetic field was applied. Electrical contact resistance was found to be in the range of from approximately 0.3 milliohm to approximately 11 milliohms, with a mean value of approximately 2.7 milliohms.

EXAMPLE 3

Materials and processing were as described above in Example 2, except that 10-by-10-mil contact pads were used. Electrical contact resistance was found to be in the range of from approximately 2 milliohms to approximately 32 milliohms, with a mean value of approximately 12 milliohms. The isolation resistance between adjacent pads was greater than $20 \times 10^6$ ohms.

A comparison sample, processed without application of a magnetic field, was found to have electrical contact resistance in the range of from approximately 2 milliohms to approximately 180 milliohms, with a mean value of approximately 47 milliohms. Poor isolation properties with occasional shorting failures were observed; this is attributed to the presence of particle strings and agglomerations extending laterally across the interpad gap of approximately 10 mils.

What is claimed is:

1. Device comprising a first component and a second component, said first component having a first surface comprising a first electrical contact, and said second component having a second surface comprising a second electrical contact,
   at least a first portion of said first electrical contact facing at least a second portion of said second electrical contact,
   the space between said first portion and said second portion being occupied essentially in an electrical interconnection layer which consists essentially of a composite material,
   said composite material comprising essentially spherical, electrically conductive particles in single-layer arrangement in a nonconductive matrix material such that particles individually form electrical connections between said first portion and said second portion,
   said device being characterized in that said particles comprise a magnetic material,
   distribution of said particles in said layer, individually or in pairs, being essentially uniform laterally as resulting from the application of an essentially uniform magnetic field essentially perpendicular to said layer before or during hardening of said matrix material.

2. Device of claim 1 in which said essentially nonconductive material is an elastomeric material.

3. Device of claim 1 in which said essentially nonconductive material is an adhesive material.

4. Device of claim 1 in which said essentially nonconductive material is a glassy material.

5. Device of claim 1 in which said essentially nonconductive material is a thermoplastic material.

6. Device of claim 1 in which a surface portion of said electrically conductive particles comprises a corrosion-resistant material.

7. Device of claim 1 in which a surface portion of said electrically conductive particles is easily deformable.

* * * * *